(12) United States Patent
Bae

(10) Patent No.: US 6,573,125 B2
(45) Date of Patent: Jun. 3, 2003

(54) METHOD OF OPENING REPAIR FUSE OF SEMICONDUCTOR DEVICE

(75) Inventor: Jun-shik Bae, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/103,440

(22) Filed: Mar. 21, 2002

(65) Prior Publication Data

US 2003/0013294 A1 Jan. 16, 2003

(30) Foreign Application Priority Data

Jul. 4, 2001 (KR) ........................................ 2001-39761

(51) Int. Cl.[7] ................................................ H01L 21/82
(52) U.S. Cl. ...................................... 438/132; 257/529
(58) Field of Search ................................ 438/132, 601; 257/529

(56) References Cited

U.S. PATENT DOCUMENTS

| | | | | |
|---|---|---|---|---|
| 6,037,648 A | * | 3/2000 | Arndt et al. | 257/529 |
| 6,399,472 B1 | * | 6/2002 | Suzuki et al. | 438/601 |
| 6,448,113 B2 | * | 9/2002 | Lee et al. | 438/132 |
| 6,507,086 B1 | * | 1/2003 | Minn et al. | 257/529 |

* cited by examiner

Primary Examiner—David Nelms
Assistant Examiner—Quoc Hoang
(74) Attorney, Agent, or Firm—Mills & Onello LLP

(57) ABSTRACT

A method of opening a repair fuse of a semiconductor device in a stable fashion is provided. According to the method, an upper plate electrode and a blocking dielectric layer are formed on a cell region and a fuse region, thereby opening the repair fuse completely.

16 Claims, 16 Drawing Sheets

METHOD OF OPENING REPAIR FUSE OF SEMICONDUCTOR DEVICE

BACKGROUND OF THE INVENTION

1. Field of the Invention

The present invention relates to a method of fabricating a semiconductor device, and more particularly, to a method of opening a repair fuse of a semiconductor device.

2. Description of the Related Art

Semiconductor memory devices have been continuously developed toward being highly integrated and having large capacity, due to great advances in material technology and thin-layer technology, as well as photolithography, new memory cell structures, transistor technology and circuit technology. In particular, as a DRAM cell is scaled down, it is very important to secure a capacitor capacity required for reading and writing data. Two types of three-dimensional capacitors have been designed to solve this problem, i.e., a stack structure of a capacitor-over-bit-line (COB) and a trench structure of a capacitor-under-bit-line (CUB). At present, the stack structure of the COB is widely used.

A reduction in the size of a semiconductor device results in an increase in the height of a capacitor of a three-dimensional DRAM cell of a stack structure, because a sufficient capacitor capacity must be secured for stable operation in the DRAM cell. Generally, the height of a capacitor is required to be more than 1 $\mu$m in the case of a highly integrated device such as a 256M-DRAM.

Also, when a general semiconductor device including a semiconductor memory device has a circuit which does not operate due to defects occurring during a manufacturing process, a repair process in which a defective circuit is replaced with an extra circuit or a trimming process in which the characteristics of a circuit are changed to be compatible with the semiconductor memory device, is performed. During the repair process and the trimming process, replacement of a circuit or change of the circuit characteristics is performed by cutting a portion of a predetermined connection of the circuit by irradiating a laser thereon. The connection which is cut by laser is called a 'fuse line' and a portion of the connection to be cut and a region encircling the portion are called a 'fuse region'. In a semiconductor device, a fuse is usually used for repairing a memory cell through the repair process. A defective cell is replaced with a redundant cell by using a laser beam or the like to cut a fuse of a redundancy decoder corresponding to an address of a main cell to be replaced.

Due to the high integration of a semiconductor memory device, a large number of redundant cells and fuses are needed for repairing the defective cells. As a result, the width and pitch of fuses is getting narrower, which requires a more precise manufacturing process. That is, a fuse corresponding to a defective cell must be accurately aligned and cut.

However, as the height of a capacitor increases, the capacitor must be etched at least up to 3 $\mu$m in order to completely open a repair fuse. For this reason, there are a lot of cases where a fuse line is not completely open or a fuse line is attacked during the etching process used to open the fuse line.

FIGS. 1 through 7 are cross-sectional views illustrating a conventional method for opening a repair fuse of a semiconductor device.

Referring to FIG. 1, a cell region (a) and a peripheral circuit region (b) and a fuse region (c) are defined in a semiconductor substrate 100. A field oxide layer 102 is formed in each of the regions (a) to (c) to electrically separate active regions in regions (a) to (c) of the semiconductor substrate 100.

Next, transistors made of a source 104, a drain 104 and a gate electrode 112 are formed in the cell region (a) and the peripheral circuit region (b). The gate electrode 112 is formed with a gate oxide layer 106, a gate-conductive layer 108 and a capping dielectric layer 110, and has a spacer 114 along its sidewalls.

Then, a first interlevel dielectric layer 115 is deposited on the semiconductor substrate 100 having the above transistors, and then is planarized through a chemical mechanical polishing (CMP).

Thereafter, the first interlevel dielectric layer 115 is patterned to form a contact pad 116 which is electrically connected to the source/drain region 104. Then, a conductive material is filled in the interlevel dielectric layer 115 and planarized through the CMP. In the cell region (a), nodes are separated as a result of the above planarizing process and thus, the contact pad 116 connected to the source/drain 104 is formed.

Next, a second interlevel dielectric layer 118 is formed on the entire semiconductor substrate 100 and planarized through the CMP.

A contact hole (not shown) passing through the second interlevel dielectric layer 118 or the second interlevel dielectric layer 118 and the first interlevel dielectric layer 115 is obtained through a general photolithography or etching process. A conductive material is filled into the contact holes, thus forming a contact plug 120.

Then, a conductive material and a capping dielectric layer are deposited on the second interlevel dielectric layer 118 and patterned, forming a bit line 126 and fuse line 126. The bit line 126 and fuse line 126 are structures in which a conductive layer 122 and a capping dielectric layer 124 are stacked sequentially and/or a spacer 128 is formed along the sidewalls. The bit line 126 is electrically connected to the contact plug 120.

A third interlevel dielectric layer 130 is formed on the entire semiconductor substrate 100 having the bit line 126 and the fuse line 126, and then is planarized through the CMP.

Next, a contact hole which passes through the second and third interlevel dielectric layers 118 and 130 is formed through a general photolithography and etching process and filled with a conductive material. As a result, a contact plug 132 is formed, which is electrically connected to the contact pad 116.

A capacitor 140 made of a lower electrode 134, a dielectric layer 136 and an upper plate electrode 138 is formed on the third interlevel dielectric layer 130 and the contact plug 132. The lower electrode 134 is electrically connected to the contact plug 132.

Referring to FIG. 2, a fourth interlevel dielectric layer 142 is deposited on the entire semiconductor substrate 100.

Referring to FIG. 3, a fourth interlevel dielectric layer 142 is planarized through the CMP. The thickness of the planarized fourth interlevel dielectric layer 142a is higher than the height of the capacitor 140.

Referring to FIG. 4, a contact hole is formed on the semiconductor substrate 100 through a general photolithography and etching process and filled with a conductive material thereby forming a metal contact 144.

Next, a conductive material is deposited on the fourth interlevel dielectric layer 142a and the metal contact 144 and patterned through a general photolithography and etching process, thereby forming a first metal interconnection layer 146. The first metal interconnection layer 146 is electrically connected to the metal contact 144.

Referring to FIG. 5, an intermetallic dielectric layer 148 is formed on the entire semiconductor substrate 100 on which the first metal interconnection layer 146 is formed.

Next, a via hole connected with the first metal interconnection layer 146 is obtained through a general photolithography and etching process and filled with a conductive material, thereby forming a via contact 150.

Thereafter, a conductive material is deposited on the via contact 150 and the intermetallic dielectric layer 148 and patterned through the general photolithography and etching process, thereby forming a second metal interconnection layer 152 which is electrically connected to the via contact 150.

Referring to FIG. 6, a passivation oxide layer 154 and a passivation nitride layer 156 are sequentially formed on the entire semiconductor substrate 100.

Referring to FIG. 7, a fuse opening process is performed using the photolithography and etching process. Specifically, the passivation nitride layer 156, the passivation oxide layer 154, the intermetallic dielectric layer 148 and the fourth interlevel dielectric layer 142a, which are formed above the fuse line 126, are dry-etched and removed. Also, a portion of the third interlevel dielectric layer 130 is dry-etched to have a recess of a predetermined depth.

As described above, the etching must be performed to a depth of at least 3 µm in order to open the repair fuse. In other words, in order to open the repair fuse, it is necessary to etch the passivation nitride layer 156, the passivation oxide layer 154, the intermetallic dielectric layer 148 and the fourth interlevel dielectric layer 142a. Thus, the repair fuse may not open or the fuse line 126 is attacked during the etching process of opening a repair fuse. Also, because the semiconductor substrate 100 has to be very deeply etched in order to open the repair fuse, it takes a long time to etch each wafer. This will put an excessive strain on etching tools and also lower throughput.

SUMMARY OF THE INVENTION

To solve the above problems, it is an objective of the present invention to provide a repair fuse opening method to open a fuse line in a semiconductor device.

In accordance with the invention, there is provided a method for opening a repair fuse of a semiconductor device. In the method, a lower electrode is formed on a semiconductor substrate in which a cell region, a peripheral circuit region and a fuse region are defined and on which predetermined under layers are formed. A dielectric layer is formed on the semiconductor substrate having the lower electrode. An upper plate electrode and a blocking dielectric layer are formed on the cell region of the semiconductor substrate having the dielectric layer and forming a blocking layer made of the upper plate electrode and the blocking dielectric layer on the fuse region of the semiconductor substrate. An interlevel dielectric layer is deposited on the semiconductor substrate, and is etched from the cell region and the fuse region until the blocking dielectric layer is exposed. Chemical mechanical polishing (CMP) is performed on the interlevel dielectric layer. A contact hole is formed in the interlevel dielectric layer and the semiconductor substrate and a conductive material is filled in the contact hole, thereby forming a metal contact. A first metal interconnection layer is formed to be electrically connected to the metal contact. An intermetallic dielectric layer is formed on the entire semiconductor substrate having the first metal interconnection layer. A via hole is formed to be connected to the first metal interconnection layer by etching the intermetallic dielectric layer, and at the same time, the intermetallic dielectric layer formed above the blocking dielectric layer of the fuse region is etched and removed. The via hole is filled with a conductive material to form a via contact. A second metal interconnection layer is formed to be electrically connected to the via contact. A passivation oxide layer and a passivation nitride layer are formed on the semiconductor substrate having the second metal interconnection layer. The passivation oxide layer and the passivation nitride layer which are formed above the blocking dielectric layer of the fuse region are etched until the blocking dielectric layer is exposed, and an exposed blocking layer of the fuse region is etched.

In one embodiment, after etching the blocking layer, a portion of the exposed semiconductor substrate is etched to recess the semiconductor substrate of the fuse region to a predetermined depth.

Preferably, the blocking dielectric layer is formed of a silicon nitride layer having a high etching selectivity with respect to the interlevel dielectric layer, the intermetallic dielectric layer and the passivation oxide layer. The blocking dielectric layer is formed to a thickness of 1000~1500 Å.

Preferably, the upper plate electrode is formed of a titanium nitride layer and a doped poly-silicon layer.

In one embodiment, the interlevel dielectric layer is formed to be thicker than the combined thickness of the lower electrode, the dielectric layer, the upper plate electrode and the blocking dielectric layer.

Preferably, the CMP is performed on the interlevel dielectric layer until the upper surface of the blocking dielectric layer has almost the same height as the upper surface of the polished interlevel dielectric layer.

It is preferable that during the CMP, ceria ($CeO_2$) is used as an abrasive, so that the intedevel dielectric layer can be selectively etched with respect to the blocking dielectric layer.

It is preferable that when etching the interlevel dielectric layer until the exposure of the blocking dielectric layer, the etching is wet etching, and a hydrofluoric acid (HF) solution is used as an etchant.

Preferably, forming the via hole and etching the intermetallic dielectric layer formed above the blocking dielectric layer of the fuse region are concurrently performed.

Preferably, the intermetallic dielectric layer is formed of boron-doped phosphosilicate glass (BPSG), phosphosilicate glass (PSG), plasma enhanced-tetra ethyl ortho silicate (PE-TEOS), undoped silicate glass (USG) or high density plasma (HDP) oxide.

Preferably, the intermetallic dielectric layer comprises a combination of spin-on-glass (SOG) and plasma enhanced-tetra ethyl ortho silicate (PE-TEOS).

Preferably, the passivation oxide layer is formed of HDP oxide.

Preferably, the passivation nitride layer is formed of a silicon nitride ($Si_3N_4$) layer.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
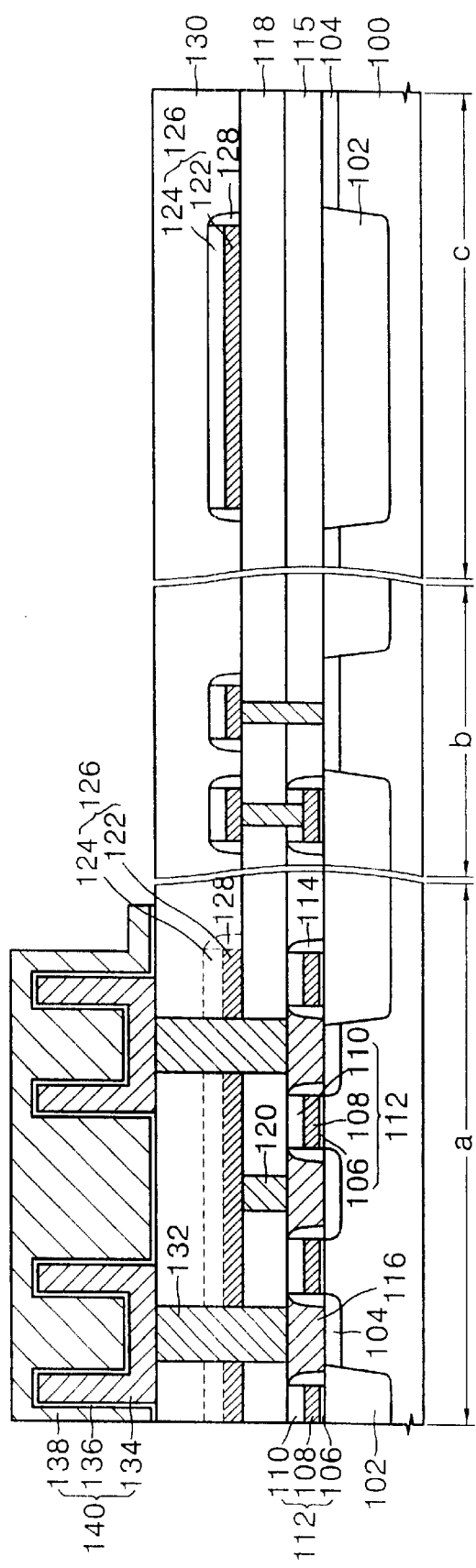
FIGS. 1 through 7 are cross-sectional views illustrating the sequence of steps of a conventional method of opening a repair fuse of a semiconductor device.
Figure 2:
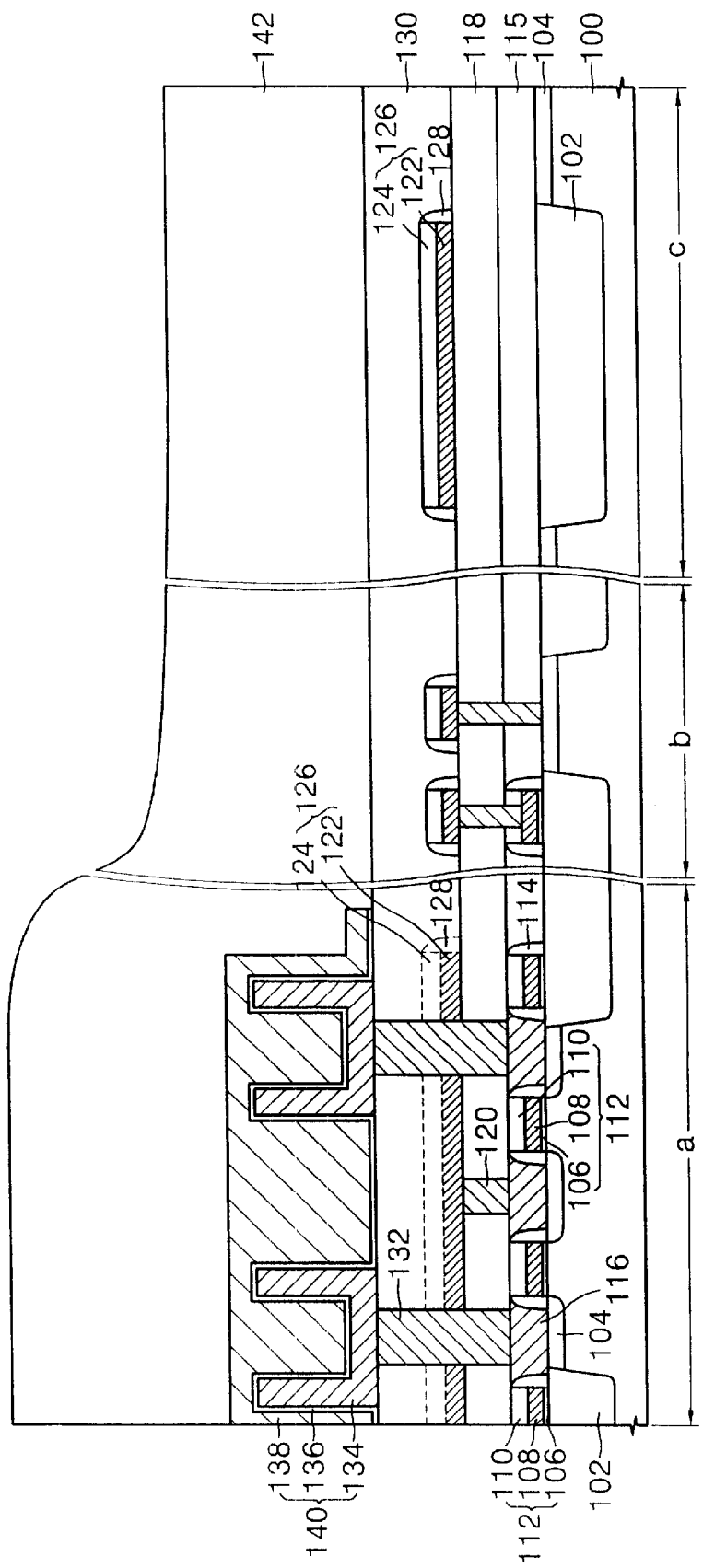
Figure 3:
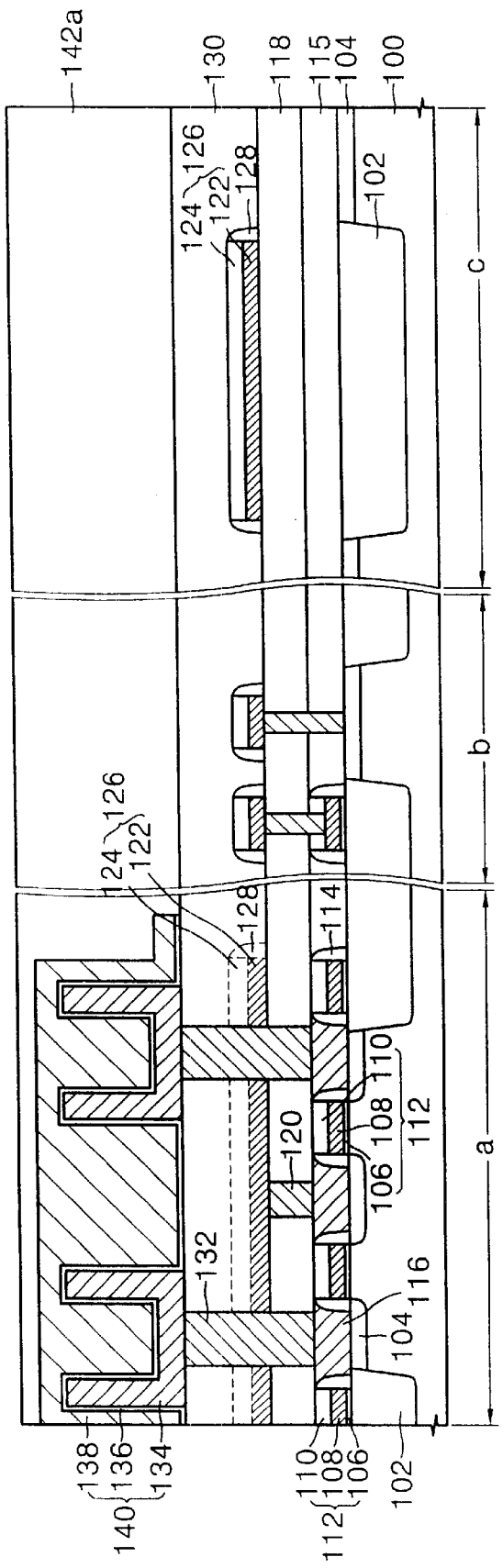
Figure 4:
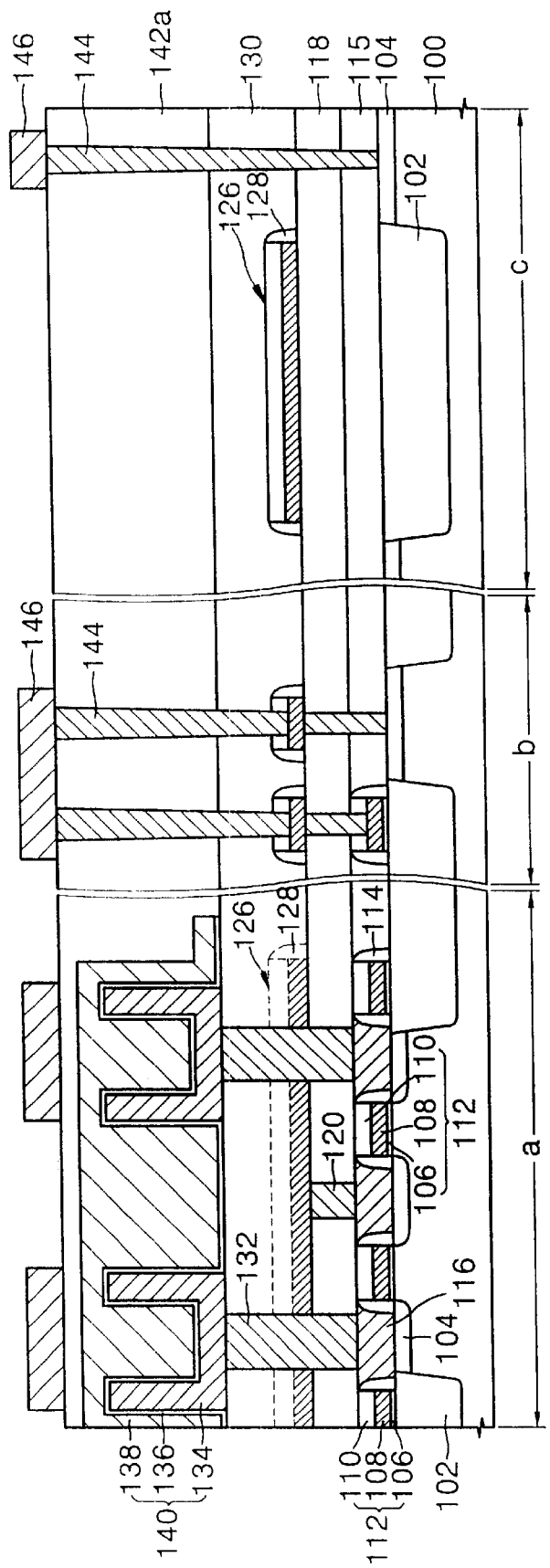
Figure 5:
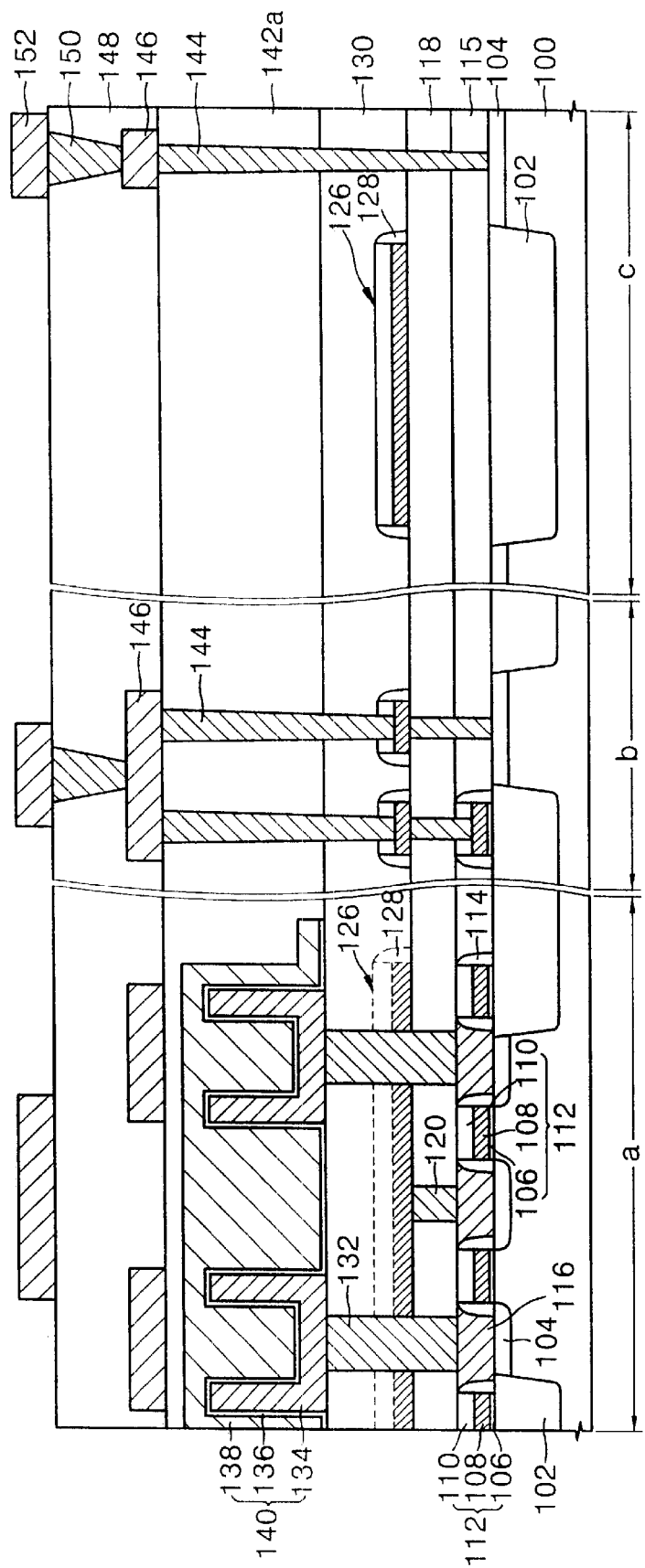
Figure 6:
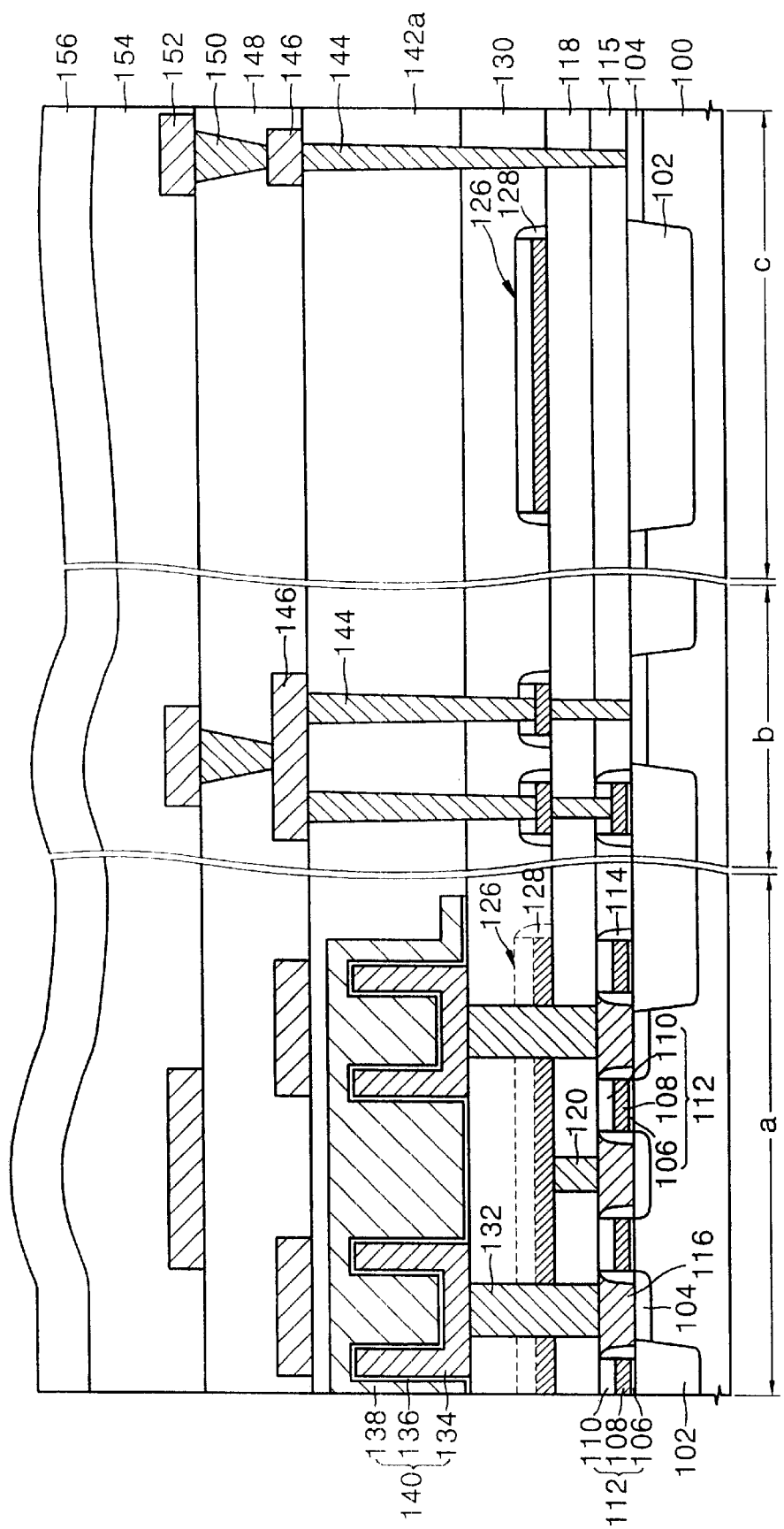
Figure 7:
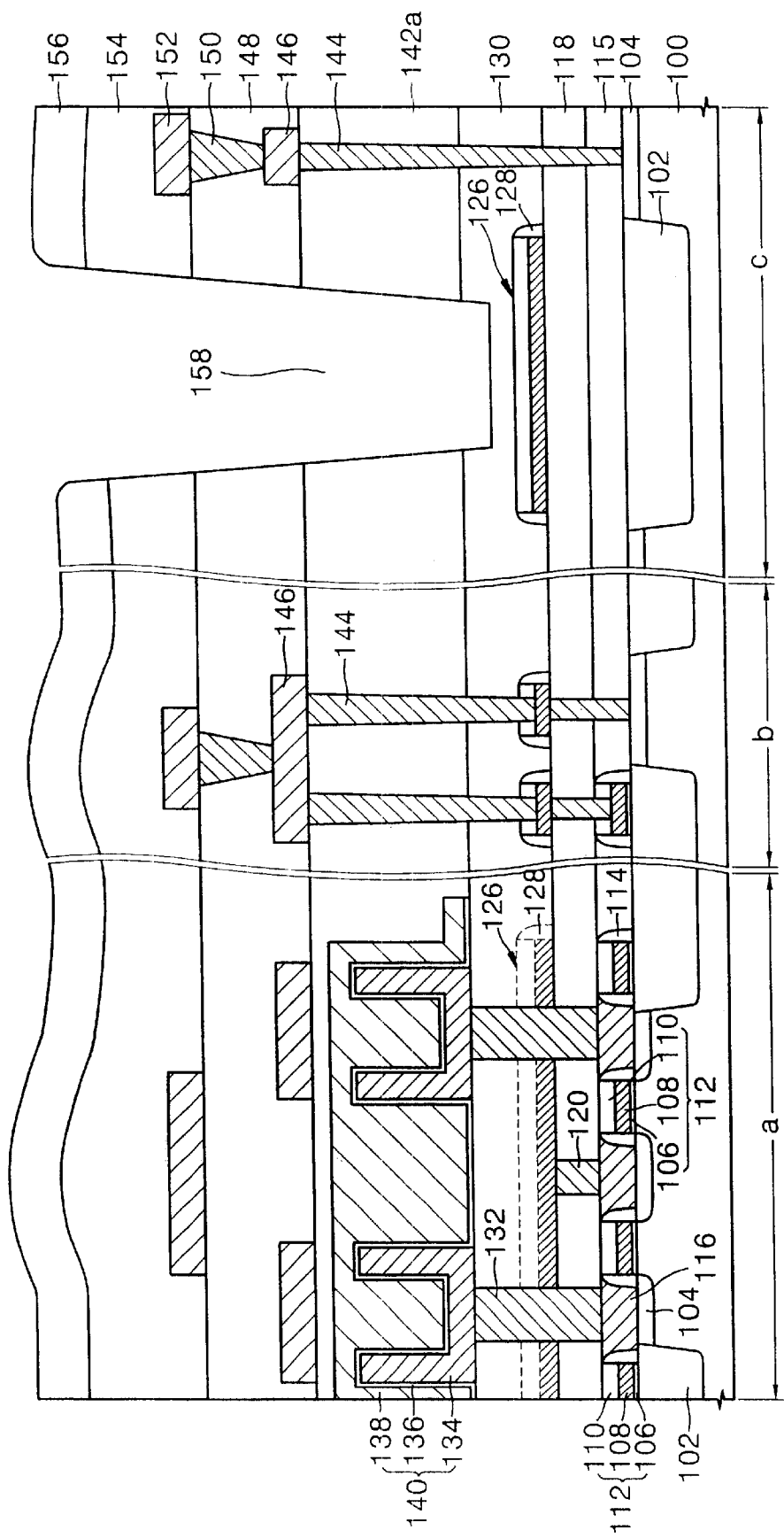

Following is a list of reference numerals used in the description of the preferred embodiments of the invention.

| | |
|---|---|
| 234: lower electrode | 236: dielectric layer |
| 238: upper plate electrode | 242: blocking dielectric layer |
| 244: fourth interlevel dielectric layer | 246: metal contact |
| 248: first metal interconnection layer | 250: intermetallic dielectric layer |
| 253: via contact | |
| 256: second metal interconnection layer | |
| 258: passivation oxide layer | 260: passivation nitride layer |

In the drawings, the thickness of layers and regions are exaggerated for clarity. It will also be understood that when a layer is referred to as being "on" another layer or substrate, it can be directly on the other layer or substrate, or intervening layers may also be present.

FIGS. 8 through 16 are cross-sectional views illustrating the sequence of steps of a method of opening a repair fuse of a semiconductor device in accordance with a preferred embodiment of the present invention.

Figure 8:
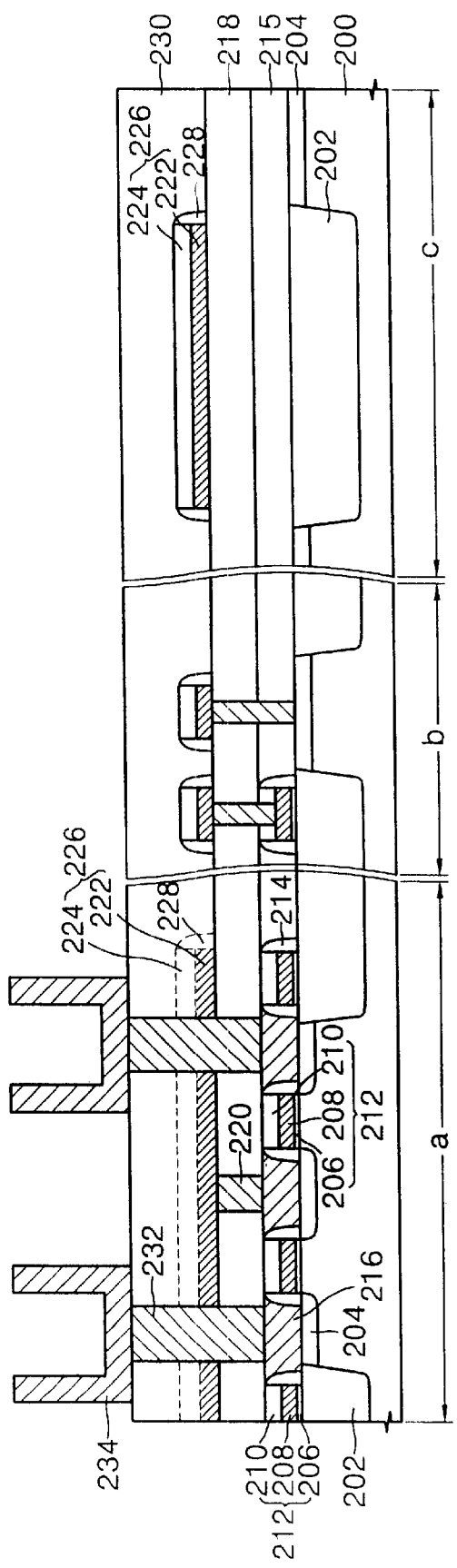
FIGS. 8 through 16 are cross-sectional views for illustrating the sequence of steps of a method of opening a repair fuse of a semiconductor device in accordance with a preferred embodiment of the present invention.

Referring to FIG. 8, a cell region (a), a peripheral circuit region (b) and a fuse region (c) are defined in a semiconductor substrate 200. Field oxide layers 202, which electrically disconnect active regions from each of the cell region (a), the peripheral circuit region (b) and the fuse region (c), are formed. The field oxide layer 202 may be formed through a general LOCOS or shallow trench isolation.

Then, transistors made of source 204, drain 204 and a gate electrode 212 are formed in the cell region (a) and the peripheral circuit region (b). The gate electrode 212 is formed of a gate oxide layer 206, a gate conductive layer 208 and a capping insulting layer 210, and has a spacer 214 on its sidewalls.

Next, a first interlevel dielectric layer 215 is deposited on the semiconductor substrate 200 having the transistors and planarized through chemical mechanical polishing (CMP). It is preferable that the first interlevel dielectric layer 215 be formed of boron-doped phosphosilicate glass (BPSG), phosphosilicate glass (PSG), plasma enhanced-tetra ethyl ortho silicate (PE-TEOS), undoped silicate glass (USG) or high-density plasma (HDP) oxide.

The first interlevel dielectric layer 215 is patterned to form a hole for a contact pad 216 that is electrically connected to the source/drain 204. A conductive material is then filled into the hole in the patterned first interlevel dielectric layer 215 and planarized through a CMP or etch-back method. In the cell region (a), node separation is made as a result of the above planarizing process thereby forming the contact pad 216 which is electrically connected to the source/drain 204.

Next, a second interlevel dielectric layer 218 is formed on the entire semiconductor substrate 200 and planarized through the CMP. The second interlevel dielectric layer 218 is preferably formed with the BPSG, the PSG, the PE-TEOS, the USG or the HDP oxide.

Then, a contact hole which passes through the second interlevel dielectric layer 218 or the second interlevel dielectric layer 218 and the first interlevel dielectric layer 215 is formed through general photolithography and etching process and filled with a conductive material thereby forming a contact plug 220. The contact plug 220 is electrically connected to the contact pad 216 of the cell region (a), the source/drain 204 and the gate conductive layer 208 of the peripheral circuit region (b).

Thereafter, a conductive material and a capping dielectric layer are deposited on the second interlevel dielectric layer 218 and patterned to form a bit line 226 and a fuse line 226. Here, the bit line 226 of the cell region (a) is indicated with a dotted line because it is not shown when the semiconductor device is cut and the bit line 226 of the fuse region (c) is referred to as a 'fuse line 226'. The bit line 226 and the fuse line 226 are formed by sequentially depositing a conductive layer 222 and a capping dielectric layer 224. Also, a spacer 228 may be formed along the sidewalls of the bit line 226 and the fuse line 226. The capping dielectric layer 224 and the spacer 228 are formed with a silicon nitride layer and the bit line 226 is electrically connected to the contact plug 220.

Next, a third interlevel dielectric layer 230 is formed on the entire semiconductor substrate 200 on which the bit line 226 and the fuse line 226 are formed and then planarized through the CMP. The third interlevel dielectric layer 230 is preferably formed of the BPSG, the PSG, the PE-TEOS, the USG or the HDP oxide. Although it is not shown, a stopper layer may be formed on the third interlevel dielectric layer 230. The stopper layer is preferably formed with a silicon nitride layer.

Then, a contact hole which passes through the second and third interlevel dielectric layers 218 and 230 is formed through general photolithography and etching process and filled with a conductive material, thus forming a contact plug 232. The contact plug 232 is electrically connected to the contact pad 216.

Next, a lower electrode 234 is formed on the third interlevel dielectric layer 230 and the contact plug 232. The lower electrode 234 is electrically connected to the contact plug 230.

Figure 9:
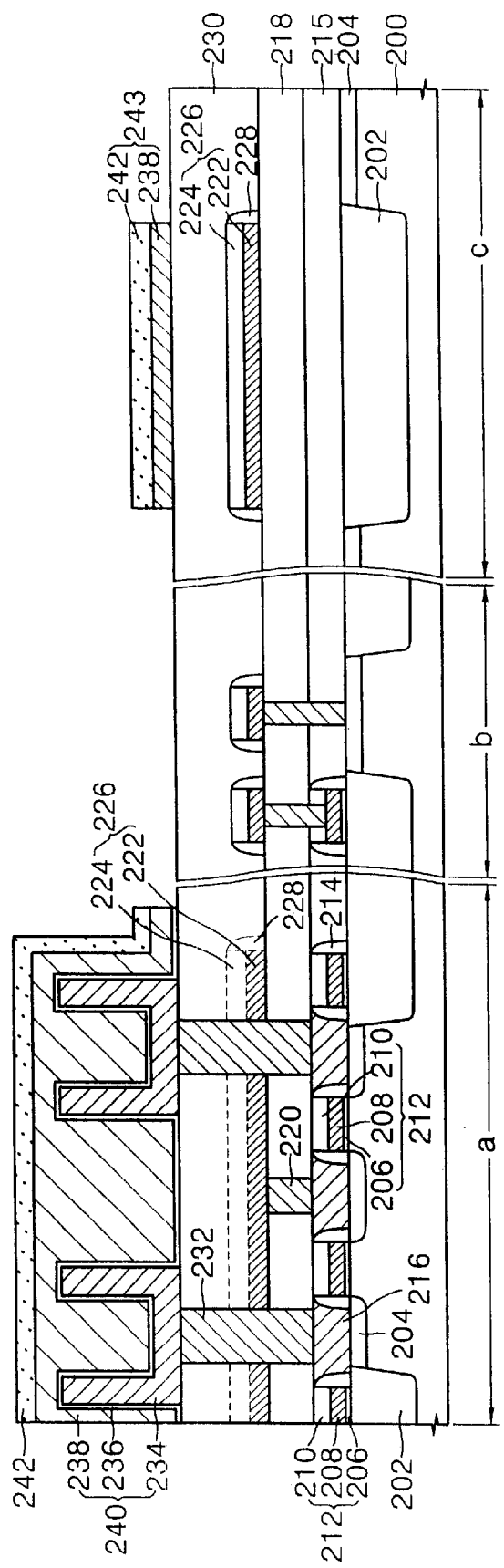

Referring to FIG. 9, a dielectric layer 236 is formed on the semiconductor substrate 200 having the lower electrode 234, and an upper plate electrode 238 and a blocking dielectric layer 242 are formed on the semiconductor substrate 200 on which the dielectric layer 236 is formed. It is preferable that the upper plate electrode 238 be formed with a titanium nitride (TiN) layer and a doped polysilicon layer and, more particularly, with a TiN layer having a thickness of 200~500 Å and a poly-silicon layer having a thickness of 1000~2000 Å. The blocking dielectric layer 242 is preferably formed of a silicon nitride layer having a high etching selectivity with respect to a fourth interlevel dielectric layer, an intermetallic dielectric layer and a passivation oxide layer, which will be described below. The blocking dielectric layer 242 is formed to a thickness of 1000~1500 Å. A blocking layer 243 made of the upper plate electrode 238 and the blocking dielectric layer 242 is formed on the fuse region (c) concurrently when forming the upper plate electrode 238 and the blocking dielectric layer 242 on the cell region (a). That is, a conductive material and a silicon nitride layer are deposited on the entire semiconductor substrate 200 and then patterned through the photolithography and etching process, thereby forming the upper plate electrode 238 and the blocking dielectric layer 242 on the cell region (a) and at the same time, forming the blocking layer 243 on the fuse region (c). Otherwise, a dielectric layer, a conductive material and a silicon nitride layer are deposited on the entire semiconductor substrate 200 and then patterned through the photolithography and etching process, thereby forming the dielectric layer 236, the upper plate electrode 238 and the blocking dielectric layer 242 on the cell region (a) and at the same time, forming the blocking layer 243 made of a dielectric layer (not shown), the upper plate electrode 238 and the blocking dielectric layer 242 on the fuse region (c). The blocking layer 243 is formed above the fuse line 226, so that it overlaps to the fuse line 226 to protect the fuse line 226 during an etching process for opening the fuse line 226.

Figure 10:
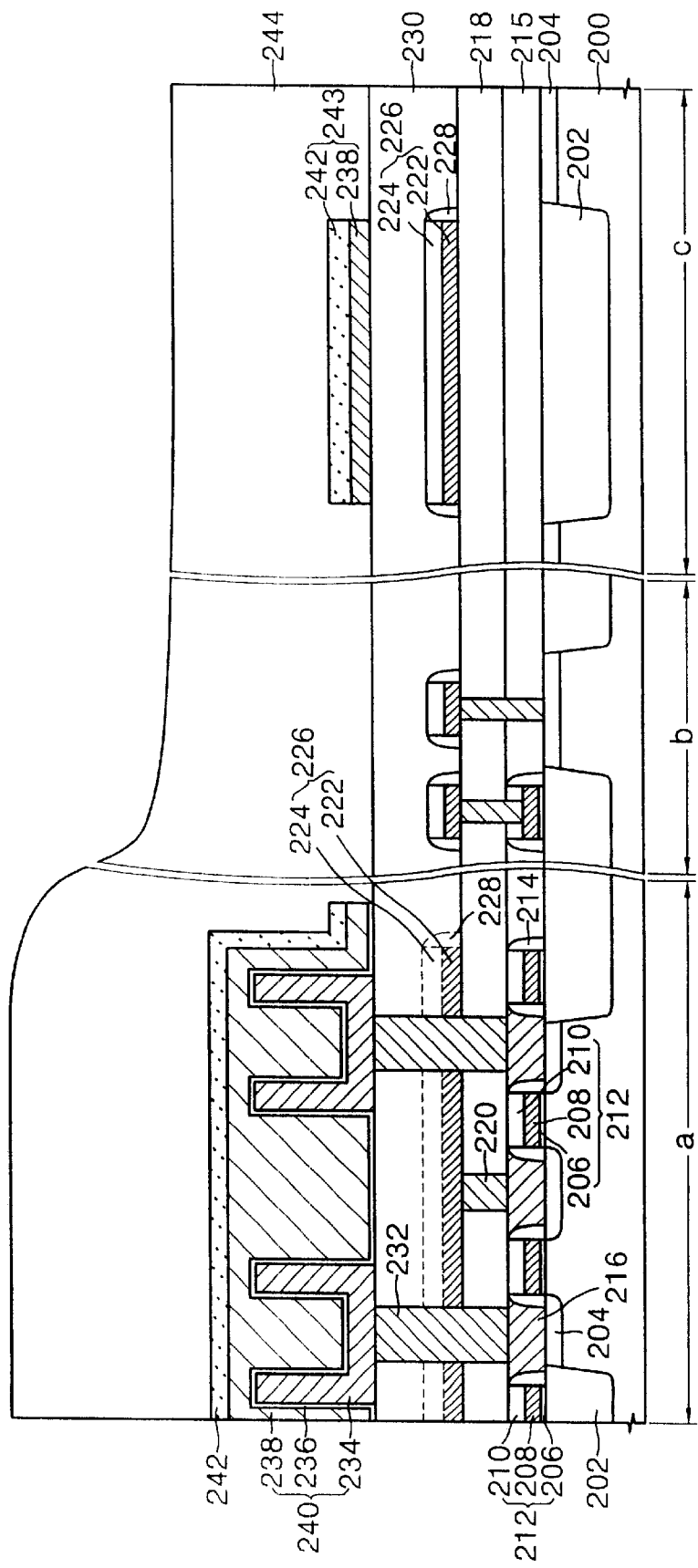

Referring to FIG. 10, a fourth interlevel dielectric layer 244 is deposited on the entire semiconductor substrate 200. The thickness of the fourth interlevel dielectric layer 244 is preferably greater than the height of the capacitor 240 and the blocking dielectric layer 242 put together. Also, the fourth interlevel dielectric layer 244 is preferably formed with the BPSG, the PSG, the PE-TEOS, the USG or the HDP oxide.

Figure 11:
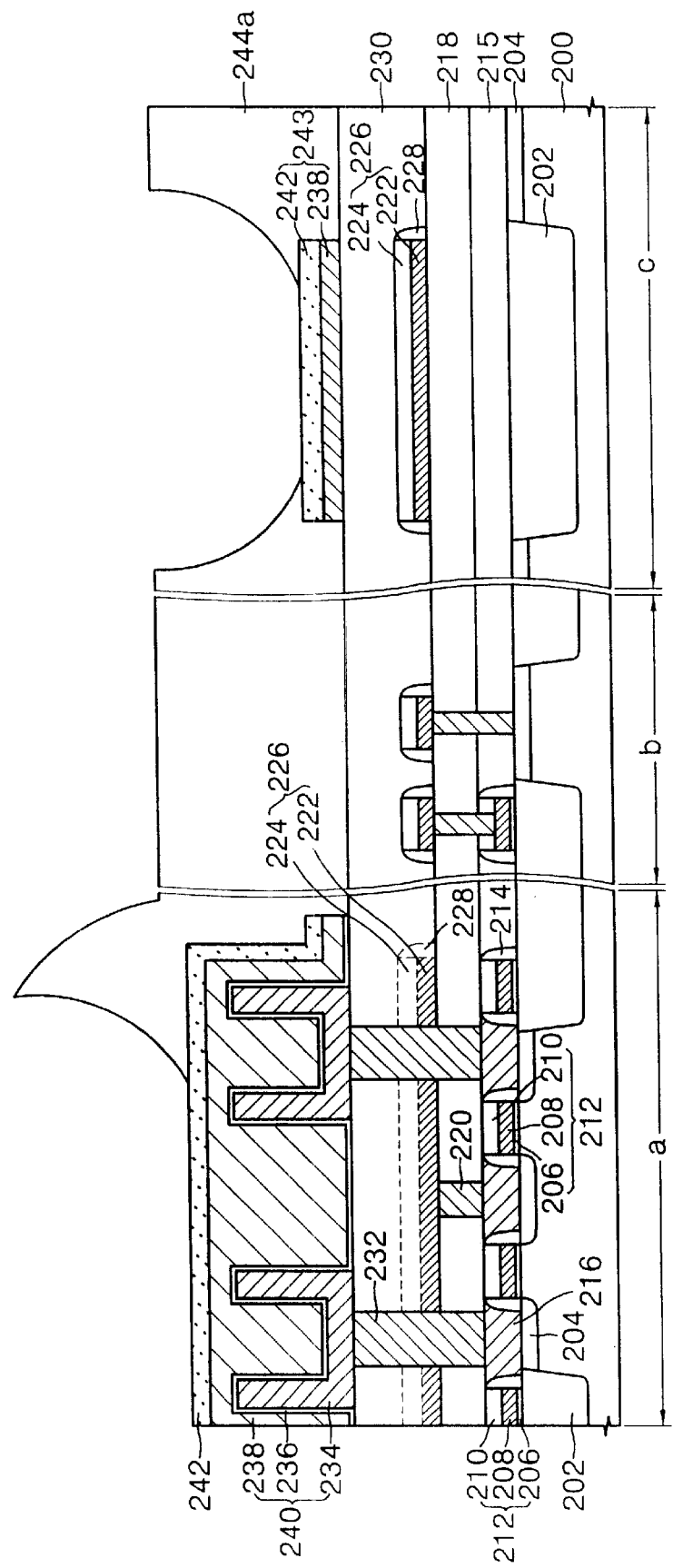

Referring to FIG. 11, the fourth interlevel dielectric layer 244 is etched from the cell region (a) and the fuse region (c) through the general photolithography and etching process until the blocking dielectric layer 242 is exposed. At that time, the blocking dielectric layer 242 formed on the cell region (a) and the fuse region (c) has a high etching selectivity with respect to the fourth interlevel dielectric layer 244 and therefore, functions as a stopper against the above etching process. FIG. 11 shows that the fourth interlevel dielectric layer 244 is wet-etched, but it may be dry-etched. During the wet etching process, it is preferable to use a hydrofluoric acid (HF) solution as an etchant.

Figure 12:
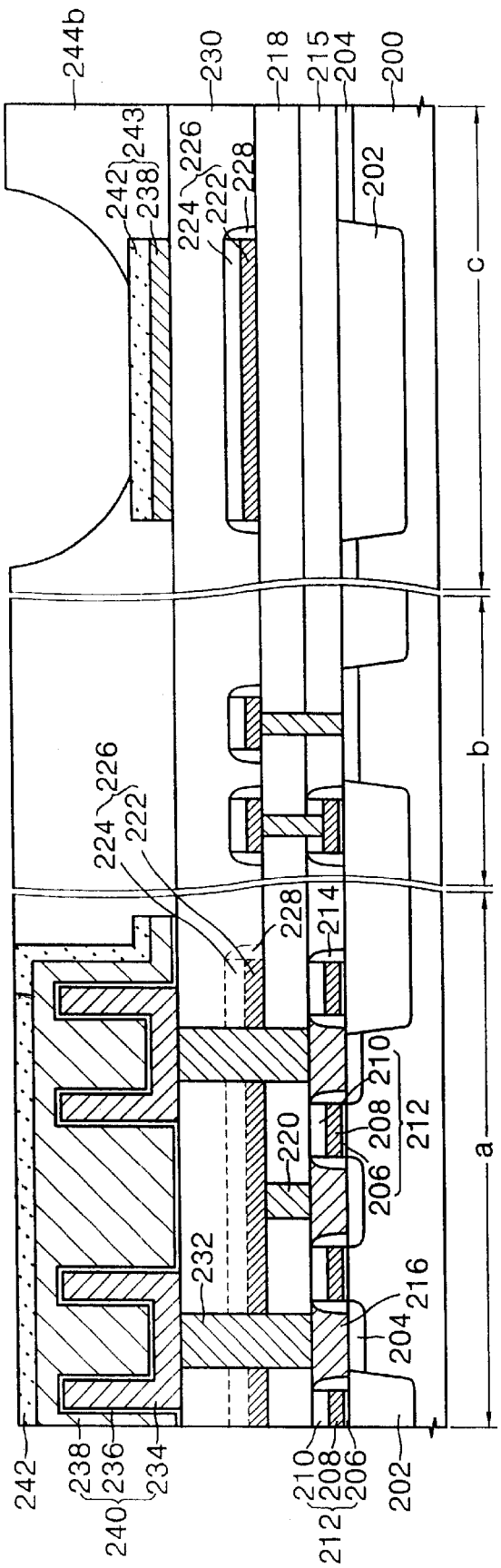

Referring to FIG. 12, the fourth interlevel dielectric layer 244 a is planarized through the CMP. Ceria (CeO$_2$) is preferably used as an abrasive during the CMP, since it can selectively etch only the fourth interlevel dielectric layer 244a while leaving most of a silicon nitride layer 242. Therefore, it is possible to selectively etch the fourth interlevel dielectric layer 244a without a loss in the blocking dielectric layer 242. After performing CMP, a planarized fourth interlevel dielectric layer 244b has almost the same height as the height of the blocking dielectric layer 242 and the fourth interlevel dielectric layer 244 put together.

Figure 13:
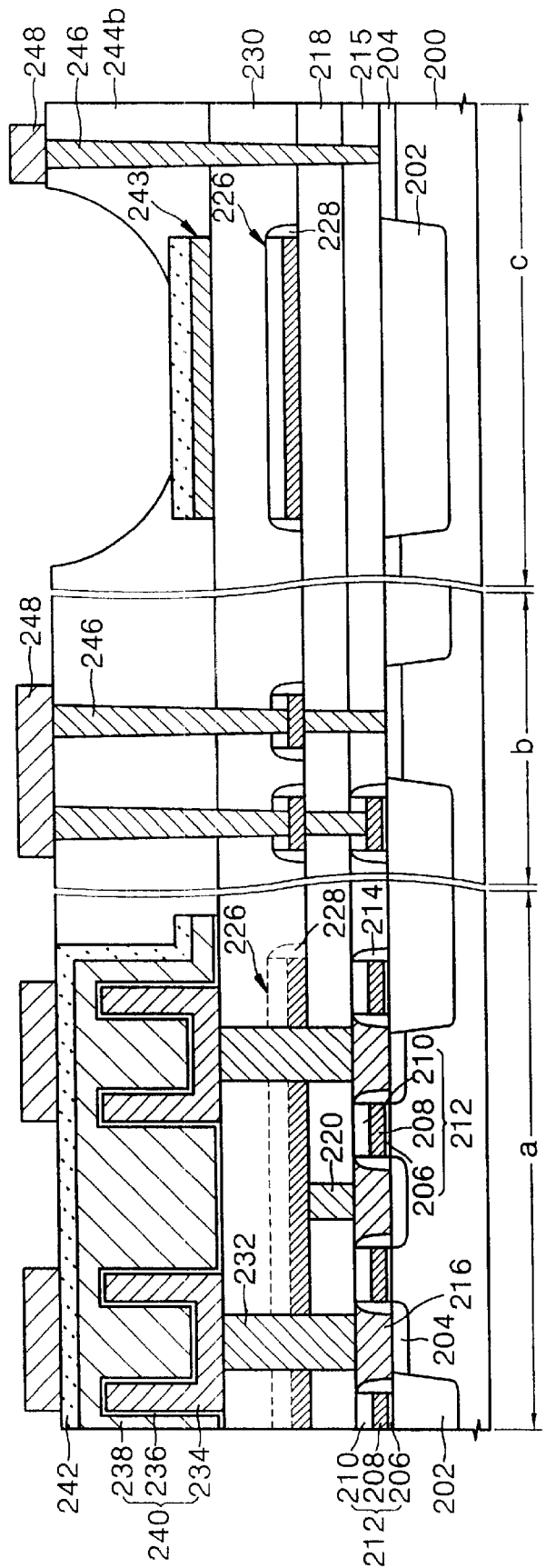

Referring to FIG. 13, a contact hole is formed on the semiconductor substrate 200 through a general photolithography and etching process and filled with a conductive material, thereby forming a metal contact 246. That is, titanium (Ti), titanium nitride (TiN) or a combination thereof is deposited as a barrier metal in the contact hole and tungsten w is then deposited on the barrier metal so that the contact hole is filled. Thereafter, a conductive material formed on the top of the fourth interlevel dielectric layer 244b is etched back, thereby forming the metal contact 246.

Then, a conductive material is deposited on the fourth interlevel dielectric layer 244b and the metal contact 246 and patterned through a photolithography and etching process thereby forming a first metal interconnection layer 248. It is preferable that the conductive material is formed of aluminum (Al). The first metal interconnection layer 248 is electrically connected to the metal contact 246.

Figure 14:
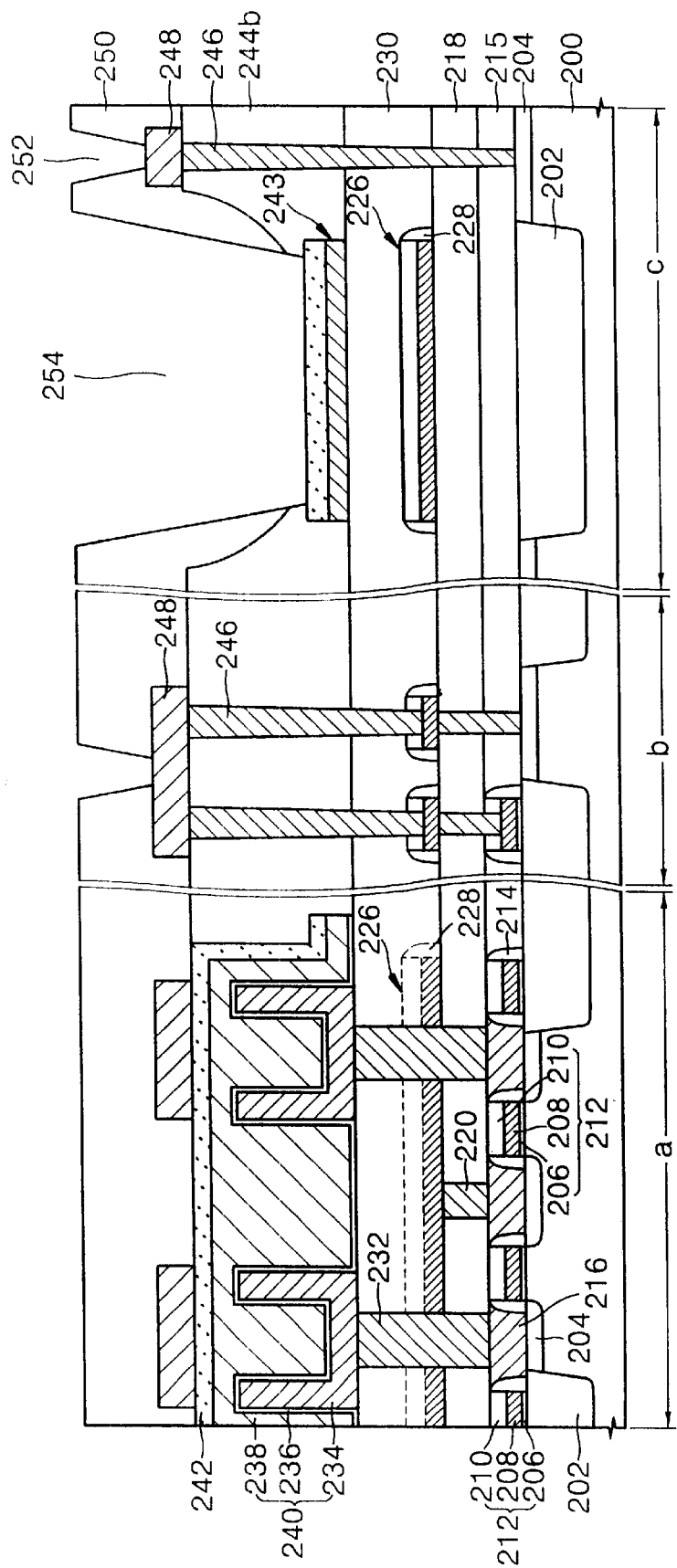

Referring to FIG. 14, an intermetallic dielectric layer 250 is formed on the entire semiconductor substrate 200 having the first metal interconnection layer 248. The intermetallic dielectric layer 250 is preferably formed of a combination of spin-on-glass (SOG) and plasma enhanced-tetra ethyl ortho silicate (PE-TEOS).

Next, the intermetallic dielectric layer 250 is patterned through a photolithography and etching process so that a via hole 252 connected to the first metal interconnection layer 248 is formed. Also, the intermetallic dielectric layer 250 formed above the blocking layer 243 in the fuse region (c) is etched while the via hole 252 is formed, thereby forming an opening 254 in the fuse region (c). The blocking dielectric layer 242 of the fuse region (c) has a high selectivity with respect to the intermetallic dielectric layer 250 and therefore, functions as a stopper against the above etching process.

Figure 15:
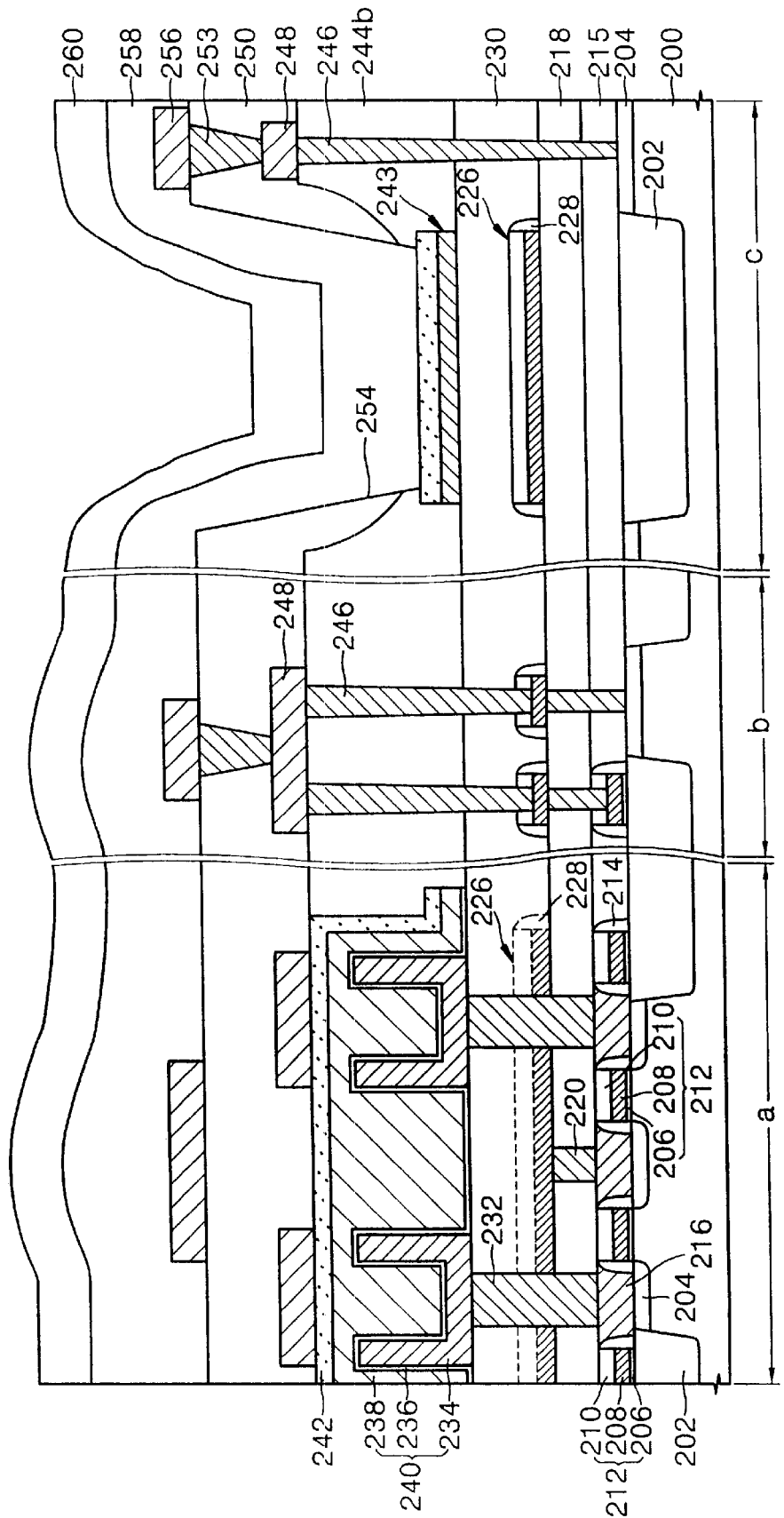

Referring to FIG. 15, the via hole 252 is filled with a conductive material, thereby forming a via contact 253. Specifically, titanium (Ti), titanium nitride (TiN) or a combination thereof is deposited as a barrier metal in the via hole 252, and aluminum (Al) is deposited on the barrier metal. The via hole 252 is buried due to the flow characteristics when aluminum is deposited on the barrier metal.

Next, a second metal interconnection layer 256 connected electrically to the via contact 253 is formed. Then, a passivation oxide layer 258 and a passivation nitride layer 260 are consecutively formed on the entire semiconductor substrate 200 having the second metal interconnection layer 256. It is preferable that the passivation oxide layer 258 be formed with the HDP oxide layer and have a thickness of 9000~11000 Å, and the passivation nitride layer 260 is formed with a silicon nitride (Si$_3$N$_4$) layer and has a thickness of 5000~7000 Å.

Figure 16:
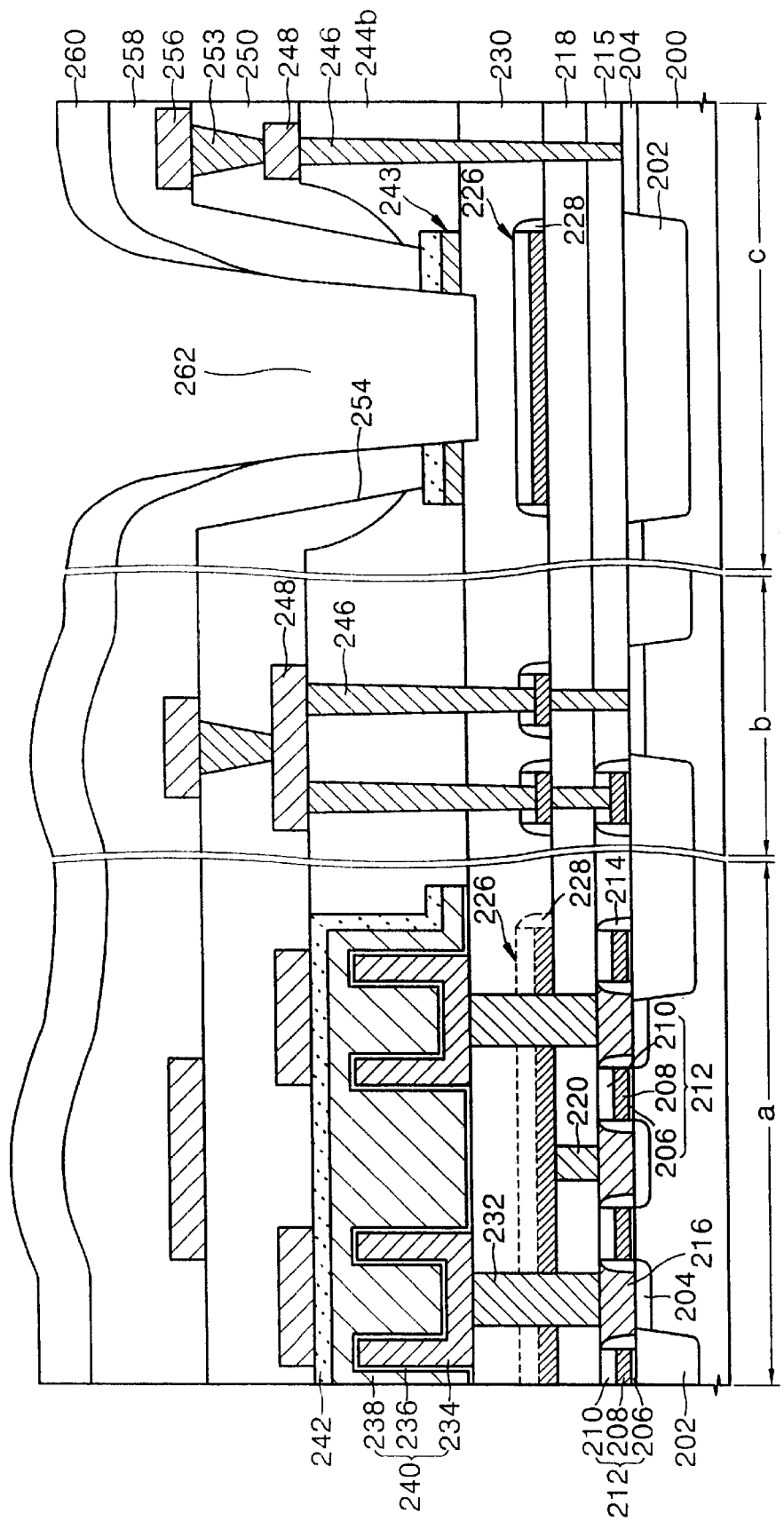

Referring to FIG. 16, a fuse open process is performed through the general photolithography and etching process. Specifically, the passivation nitride layer 260 and the passivation oxide layer 258 formed in an opening 254, which is formed above the fuse line 226, are dry-etched and removed. Here, the blocking dielectric layer 242 formed in the fuse region (c) has a high selectively with respect to the passivation oxide layer 258 and therefore, functions as a stopper against the etching process.

Next, during the fuse repair process, the blocking layer 243 formed above the fuse line 226 is dry-etched and removed so that the fuse line 226 can be cut by laser.

Thereafter, the third interlevel dielectric layer 230 is partially dry-etched to have a recess of a predetermined depth. In the prior art, the repair fuse was not open until all the passivation nitride layer, the passivation oxide layer, the intermetallic dielectric layer and the fourth interlevel dielectric layer were etched. In this case, there were a lot of portions to be etched and thus, layers or layers were not exactly etched. Accordingly, it is difficult to evenly leave the third interlevel dielectric layer 230 on the fuse line 226. In contrast, according to this embodiment of the present invention, the repair fuse is open by etching only a portion of the third interlevel dielectric layer 230 after the removal of the blocking layer 243. As a result, the third interlevel dielectric layer 230 is left evenly on the fuse line 226.

In the method for opening a repair fuse of a semiconductor device according to the present invention, the problems of the prior art, e.g., a repair fuse not being opened and the fuse line being attacked during an etching process for opening a repair fuse, can be considerably improved. That is, it is possible to stably open a repair fuse because the blocking layer is formed above the fuse line and the amount of etching is remarkably reduced during the repair fuse opening process compared to the prior art, thereby increasing throughput. In addition, a laser repair process can be improved because the third interlevel dielectric layer is even above the fuse line.

While the present invention has been particularly shown and described with reference to the preferred embodiment thereof, the present invention is not restricted to the above embodiment. Further, it will be understood by those skilled in the art that various changes in form and details may be made without departing from the spirit and scope of the invention as defined by the appended claims.

What is claimed is:

1. A method for opening a repair fuse of a semiconductor device comprising:

forming a lower electrode on a semiconductor substrate in which a cell region, a peripheral circuit region and a fuse region are defined and on which predetermined under layers are formed;

forming a dielectric layer on the semiconductor substrate having the lower electrode;

forming an upper plate electrode and a blocking dielectric layer on the cell region of the semiconductor substrate having the dielectric layer and forming a blocking layer made of the upper plate electrode and the blocking dielectric layer on the fuse region of the semiconductor substrate;

depositing an interlevel dielectric layer on the semiconductor substrate;

etching the interlevel dielectric layer from the cell region and the fuse region until the blocking dielectric layer is exposed;

performing chemical mechanical polishing (CMP) on the interlevel dielectric layer;

forming a contact hole in the interlevel dielectric layer and the semiconductor substrate and enclosing a conductive material in the contact hole, thereby forming a metal contact;

forming a first metal interconnection layer connected electrically to the metal contact;

forming an intermetallic dielectric layer on the semiconductor substrate having the first metal interconnection layer;

forming a via hole to be connected to the first metal interconnection layer by etching the intermetallic dielectric layer, and simultaneously etching and removing the intermetallic dielectric layer formed above the blocking dielectric layer of the fuse region;

forming a via contact by filling a conductive material in the via hole;

forming a second metal interconnection layer connected electrically to the via contact;

forming a passivation oxide layer and a passivation nitride layer on the entire semiconductor substrate having the second metal interconnection layer;

etching the passivation oxide layer and the passivation nitride layer which are formed above the blocking dielectric layer of the fuse region until the blocking dielectric layer is exposed; and etching an exposed blocking layer of the fuse region.

2. The method of claim 1, further comprising etching a portion of the exposed semiconductor substrate after etching the blocking layer, so that the semiconductor substrate of the fuse region is recessed to a predetermined depth.

3. The method of claim 1, wherein the blocking dielectric layer is formed of a material layer having a high etching selectivity with respect to the interlevel dielectric layer, the intermetallic dielectric layer and the passivation oxide layer.

4. The method of claim 3, wherein the material layer having a high selectivity with respect to the interlevel dielectric layer, the intermetallic dielectric layer and the passivation oxide layer is a silicon nitride layer.

5. The method of claim 1, wherein the blocking dielectric layer is formed to have a thickness of 1000~1500 Å.

6. The method of claim 1, wherein the upper plate electrode is formed of a titanium nitride layer and a doped poly-silicon layer.

7. The method of claim 1, wherein the interlevel dielectric layer is formed to be thicker than the combined thickness of the lower electrode, the dielectric layer, the upper plate electrode and the blocking dielectric layer.

8. The method of claim 1, wherein the CMP is performed on the interlevel dielectric layer until the upper surface of the blocking dielectric layer has almost the same height as the upper surface of the polished interlevel dielectric layer.

9. The method of claim 1, wherein in the step of performing CMP on the interlevel dielectric layer, ceria ($CeO_2$) is used as an abrasive, so that the interlevel dielectric layer can be selectively etched with respect to the blocking dielectric layer.

10. The method of claim 1, wherein etching the interlevel dielectric layer until the exposure of the blocking dielectric layer comprises wet etching.

11. The method of claim 10, wherein during the wet etching a hydrofluoric acid (HF) solution is used as an etchant.

12. The method of claim 1, wherein forming the via hole and etching the intermetallic dielectric layer formed above the blocking dielectric layer of the fuse region are concurrently performed.

13. The method of claim 1, wherein the intermetallic dielectric layer is formed of at least one of boron-doped phosphosilicate glass (BPSG), phosphosilicate glass (PSG), plasma enhanced-tetra ethyl ortho silicate (PE-TEOS), undoped silicate glass (USG) and high density plasma (HDP) oxide.

14. The method of claim 1, wherein the intermetallic dielectric layer is formed of a combination of spin-on-glass (SOG) and plasma enhanced-tetra ethyl ortho silicate (PE-TEOS).

15. The method of claim 1, wherein the passivation oxide layer is formed of the HDP oxide.

16. The method of claim 1, wherein the passivation nitride layer is formed of silicon nitride ($Si_3N_4$).

* * * * *